(12) United States Patent
Chou et al.

(10) Patent No.: US 8,258,393 B2
(45) Date of Patent: Sep. 4, 2012

(54) NANOWIRE THERMOELECTRIC DEVICE

(75) Inventors: Ya-Wen Chou, Hsinchu County (TW); Ming-Shan Jeng, Taipei County (TW); Shih-Kuo Wu, Hsinchu (TW); Chang-Chung Yang, Taipei (TW); Kuei-Chien Chang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 408 days.

(21) Appl. No.: 12/541,981

(22) Filed: Aug. 17, 2009

(65) Prior Publication Data

US 2010/0147350 A1    Jun. 17, 2010

(30) Foreign Application Priority Data

Dec. 12, 2008 (TW) .............................. 97148658 A

(51) Int. Cl.
*H01L 35/00* (2006.01)
(52) U.S. Cl. ........ 136/205; 136/200; 136/203; 136/204; 136/207; 136/212
(58) Field of Classification Search .................. 136/205, 136/200, 203, 204, 207, 212
See application file for complete search history.

(56) References Cited

U.S. PATENT DOCUMENTS

| 4,971,623 | A | 11/1990 | Wilford |
| 5,837,929 | A | 11/1998 | Adelman |
| 6,787,691 | B2 | 9/2004 | Fleurial et al. |
| 6,818,470 | B1 | 11/2004 | Acklin et al. |
| 6,828,579 | B2 | 12/2004 | Ghamaty et al. |
| 2004/0035457 | A1* | 2/2004 | Kribus .......................... 136/205 |
| 2006/0266402 | A1* | 11/2006 | Zhang et al. .................. 136/205 |
| 2008/0202575 | A1* | 8/2008 | Ren et al. ....................... 136/201 |

FOREIGN PATENT DOCUMENTS

| TW | 200634263 | 10/2006 |
| TW | I264837 | 10/2006 |

* cited by examiner

*Primary Examiner* — Jennifer Michener
*Assistant Examiner* — Matthew Martin
(74) *Attorney, Agent, or Firm* — Jianq Chyun IP Office

(57) ABSTRACT

A thermoelectric device is provided. The thermoelectric device includes a P-type thermoelectric component, an N-type thermoelectric component, and an electrically conductive layer. Each of the P-type thermoelectric component and the N-type thermoelectric component includes a substrate and a nanowire structure. The conductive layer connects the P-type thermoelectric component set with the N-type thermoelectric component set. The thermoelectric device is adapted for recycling heat generated by the heat source, and for effectively converting the heat into electrical energy.

10 Claims, 3 Drawing Sheets

NANOWIRE THERMOELECTRIC DEVICE

CROSS-REFERENCE TO RELATED APPLICATION

This application claims the priority benefit of Taiwan application serial no. 97148658, filed on Dec. 12, 2008. The entirety of the above-mentioned patent application is hereby incorporated by reference herein and made a part of this specification.

BACKGROUND OF THE INVENTION

1. Field of the Invention

The present invention generally relates to a thermoelectric device, and more particularly, to a thermoelectric device including nanowire structures.

2. Description of Related Art

In accordance with the miniaturizing tendency of electronic and mechanical components or systems, power supplies for driving such systems have also to be correspondingly spatially miniaturized. For example, personal mobile apparatuses, robot systems, and portable systems such as communication devices and electronic products are getting smaller. Correspondingly, the demand for small power supplies is gradually increasing. As such, a power system having a high power density for substituting conventional batteries is highly desired. Currently developed micro-engine technology, with semiconductor processing, has several technical advantages such as smaller size, higher power density, and compatibility than conventional batteries. However, a micro-engine featured in large ratio of surface area to volume within a small space. Therefore, more heat loss and friction loss occur at the surface of the micro-engine. As such, a thermoelectric power generator utilize for effectively recycling surface heat loss and improving the combustion intensity of the micro-engine.

The power generation principle of thermoelectric device relies upon the thermoelectric effect (also known as Seebeck effect) of a thermoelectric material. According to the thermoelectric effect, a current generated by a temperature difference which between a provided heat source and an ambient temperature. Being a solid state material having no moving part, the thermoelectric device has the advantages of high reliability, long lifespan, and noiselessness. Further, when generating power with waste heat, the thermoelectric device is adapted for reducing the environmental thermal pollution.

A thermoelectric device is a combination of multiple groups of N-type and P-type thermoelectric materials. Each group produce current and electrical energy in accordance with temperature difference along the thermoelectric material. The electrical energy is directly proportional with an area of the thermoelectric material, and is inversely proportional with length of the thermoelectric material. Therefore, a thermoelectric device having a larger area to length ratio outputs more electrical energy. In a modularization design, the interface resistance between the thermoelectric material, the electrically conductive layer and the thermally conductive layer is a very important rule on the system efficiency. In addition, conventional thermoelectric block materials have a restricted area to length ratio due to fabrication. It limited electrical energy output from the thermoelectric device. For realistic application, the output electrical power increase through increase the amount of the thermoelectric modules. The weight and cost of system will increase in the same time, and thus disadvantageously affects the application of the thermoelectric device.

SUMMARY OF THE INVENTION

Accordingly, the present invention provide a thermoelectric material including nanowire structures, and thermoelectric component set composed of an N-type thermoelectric material and a P-type thermoelectric material, and a thermoelectric device applying with such a thermoelectric component set. The present invention is adapted for achieving an optimal performance of thermo-to-electric energy conversion.

The present invention provides thermoelectric device, adapted for the combination with heat source. The thermoelectric device includes one or more thermoelectric component set(s). Each thermoelectric component set includes a first thermoelectric component, a second thermoelectric component, and an electrically conductive layer. The first thermoelectric component includes a first substrate and a first nanowire structure. The first substrate dispose on the heat source, and the first nanowires configure on the first substrate. The second thermoelectric component includes a second substrate and a second nanowire structure. The second substrate dispose on the heat source, and the second nanowires configure on the second substrate. Further, the electrically conductive layer covers and couples to the first nanowire structure and the second nanowire structure. In case the thermoelectric device includes a plurality of thermoelectric component sets, the thermoelectric component sets are electrically connected one to another via an electric conductive layer and conducting wires configure a passage of current for outputting the electrical energy.

According to the above description, the present invention integrates nanowire structures to thermoelectric device, for improving conversion efficiency of the thermoelectric device. Meanwhile, the thermoelectric device of the present invention is made of a semiconductor material and fabricated by a micro-electromechanical processing, and thus is adapted for substituting the conventional thermoelectric block materials and the module design thereof, and for further reducing the thermal resistance loss and the electric resistance loss occurred at the interface with the heat source.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
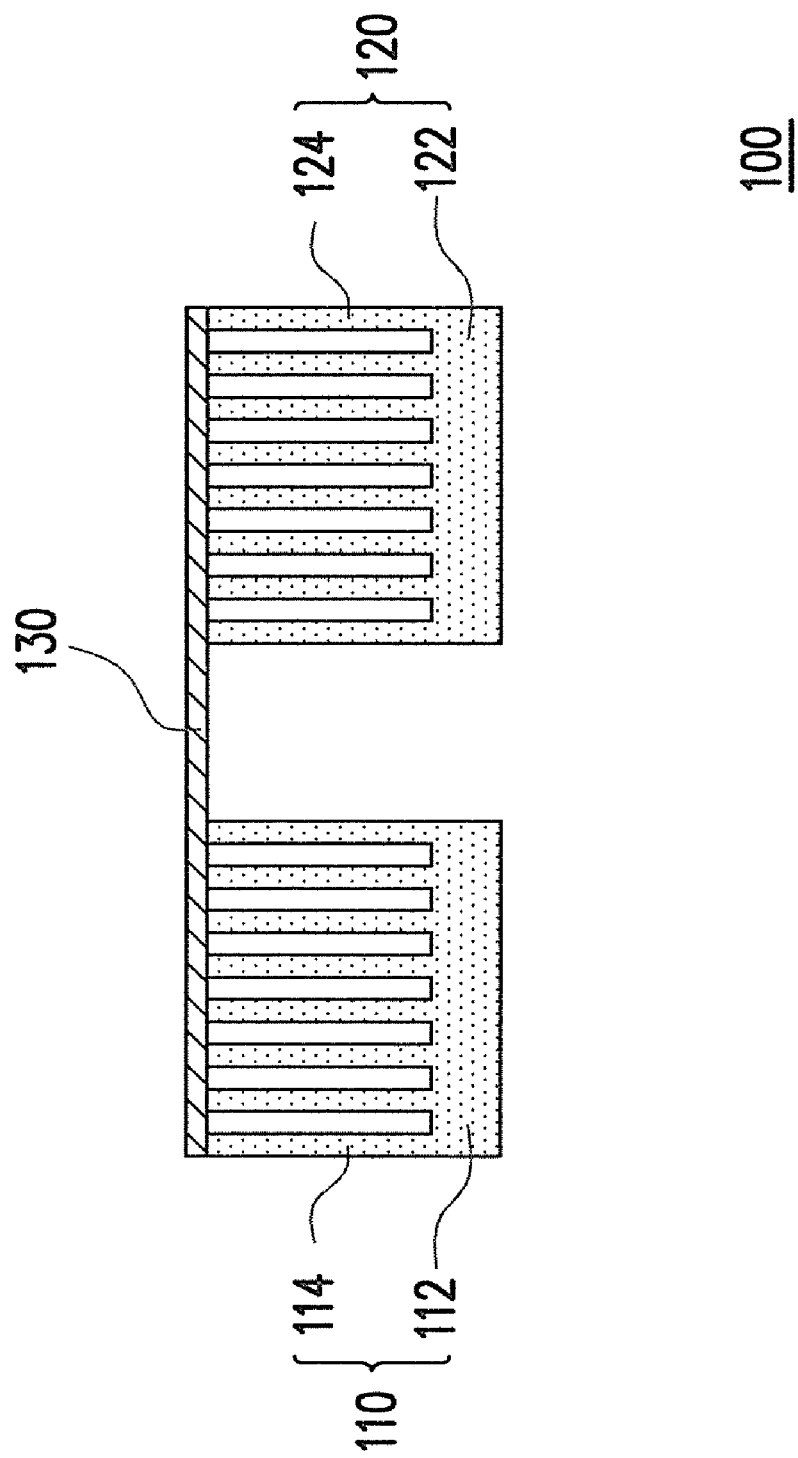
FIG. 1 is a schematic diagram illustrating a thermoelectric component set according to an embodiment of the present invention.

Accompanied drawing of examples will now be made in detail to the present preferred embodiments of the invention. Wherever possible, the same reference numbers are used in the drawings and the description to refer to the same or like parts.

The present invention provides a thermoelectric device. In accordance with the thermoelectric characteristic, the thermoelectric device converts a thermal energy existed over two ends of a thermoelectric material into an electrical energy for outputting. According to the present invention, the thermoelectric material including a nanowire structure combine with a heat source such as a micro-power system, for recycling a heat loss occurred at a high temperature surface of the heat source. In such a way, the combustion intensity of the heat source can be improved, and the heat loss can be used for generating electrical power.

FIG. 1 is a schematic diagram illustrating a thermoelectric component set according to an embodiment of the present invention.

Referring to FIG. 1, in the current embodiment, a thermoelectric component set 100 includes a first thermoelectric component 110, a second thermoelectric component 120, and an electrically conductive layer 130. The first thermoelectric component 110 includes a first substrate 112, and a first nanowire structure 114. The second thermoelectric component 120 includes a second substrate 122, and a second nanowire structure 124. The first nanowire structure 114 and the second nanowire structure 124 of thermoelectric component set 100 are configured at a lateral side of the first substrate 112 and a lateral side of the second substrate 122, respectively. The electrically conductive layer 130 covers the first nanowire structure 114 and the second nanowire structure 124, and are coupled to the first nanowire structure 114 and the second nanowire structure 124 either.

In the current embodiment, the first thermoelectric component 110 and the second thermoelectric component 120 for example are fabricated from a silicon substrate. For example, the first thermoelectric component 110 is made of a P-type thermoelectric material, and the second thermoelectric component 120 is made of an N-type thermoelectric material. In this case, the first nanowire structure 114 and the first substrate 112 of the first thermoelectric component 110 for example are integrally formed. Similarly, the second nanowire structure 124 and the second substrate 122 of the second thermoelectric component 120 for example are integrally formed.

Figure 2:
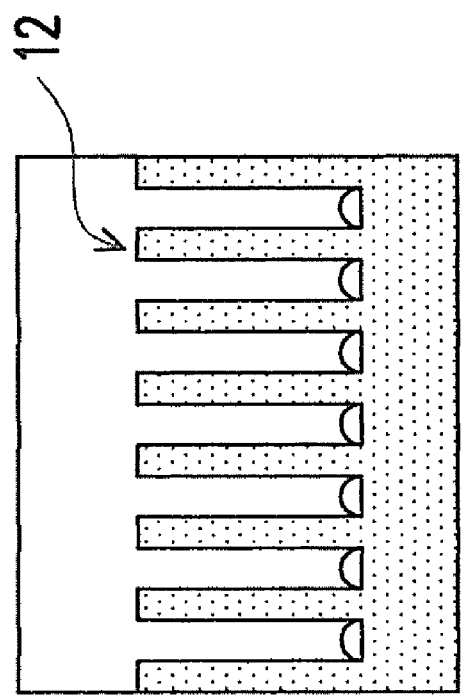
FIG. 2 illustrates a method for fabricating a nanowire structure according to an embodiment of the present invention.
Figure 2:
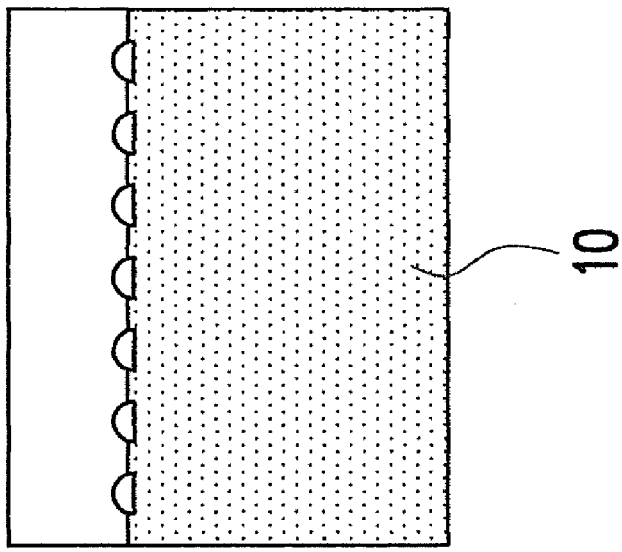

Specifically, in the current embodiment, the first substrate 112 and the second substrate 122, as well as the first nanowire structure 114 and the second nanowire structure 124 configured thereupon can be fabricated by a semiconductor processing. FIG. 2 illustrates a method for fabricating a nanowire structure according to an embodiment of the present invention. Referring to FIG. 2, at first, a silicon substrate 10 is provided, and then a hydrofluoric acid solution is applied to the silicon substrate 10 to execute a chemical etching process. In such a way, a nanowire structure 12 having a high aspect ratio is formed on the surface of the silicon substrate 10.

The value of the electrical energy outputted from the thermoelectric material is directly proportional with an area of the thermoelectric material, and is inversely proportional with a length of the thermoelectric material. Therefore, a thermoelectric material having a larger area to length ratio outputs more electrical energy. In the current embodiment, the nanowire structure 12 obtained by the chemical etching process is configured with a high aspect ratio, and thus achieves a larger area to length ratio, thus obtaining a larger value of the electrical energy for outputting. Further, the nanowire structure 12 obtained by the chemical etching process has a rough surface, which is helpful for reducing a thermal conductivity thereof, and improving a thermoelectric figure of merit (ZT value) of the thermoelectric material. Since the nanowire structure 12 has a rough surface, it is capable of drastically improving the probability of phonons being scattered during the transmittance of the phonons in the material, and shortening the mean free path of the phonons. As such, the thermal conductivity of the material can be drastically reduced, and the ZT value of the thermoelectric material can be improved.

Generally, conventional silicon materials usually have extremely high thermal conductivity coefficients, about 150 W/(m–K), and unsatisfactory thermoelectric features. In accordance with the current embodiment, the thermal conductivity coefficient of a low dimensional nanowire structure having a linewidth of 50 nm and a rough surface may achieve 1/100 of a silicon block material, and the ZT value thereof may achieve more than 0.6. As such, a low dimensional nanowire structure has the potential of improving the thermoelectric performance of the thermoelectric material. However, although having advantages in thermoelectric performance, a single nanowire has certain difficulty and is restricted in practical application. The present invention directly executes a chemical etching process on a silicon substrate, e.g., a silicon wafer, thus obtaining the thermoelectric component set including the silicon substrate serving as the thermoelectric substrates and the nanowire structures. The currently obtained nanowire structure, which linewidth has not yet been uniformed, has a thermal conductivity coefficient about 55 to 68 W/(m–K), which is about ½ of the silicon block material, and is sufficient to be applied for recycling the waste heat for power generation.

Briefly, a nanowire structure obtained according to the present invention has the following advantages. First, such a nanowire structure made of a silicon material provides an improved thermo-to-electric energy conversion efficiency and output power. Further, the substrate and the nanowire structure are made of an identical silicon material, and there are a low electric resistance and a low thermal resistance at the interface between the substrate and the nanowire structure. Furthermore, the P-type or N-type doping technique for such a silicon substrate is well established, and convenient for controlling. Finally, when fabricating the nanowire structure by the chemical etching process (chemical plating process), a large area and a large amount of nanowire structures can be simultaneously fabricated on the silicon substrate, and therefore the production cost can be saved.

Figure 3:
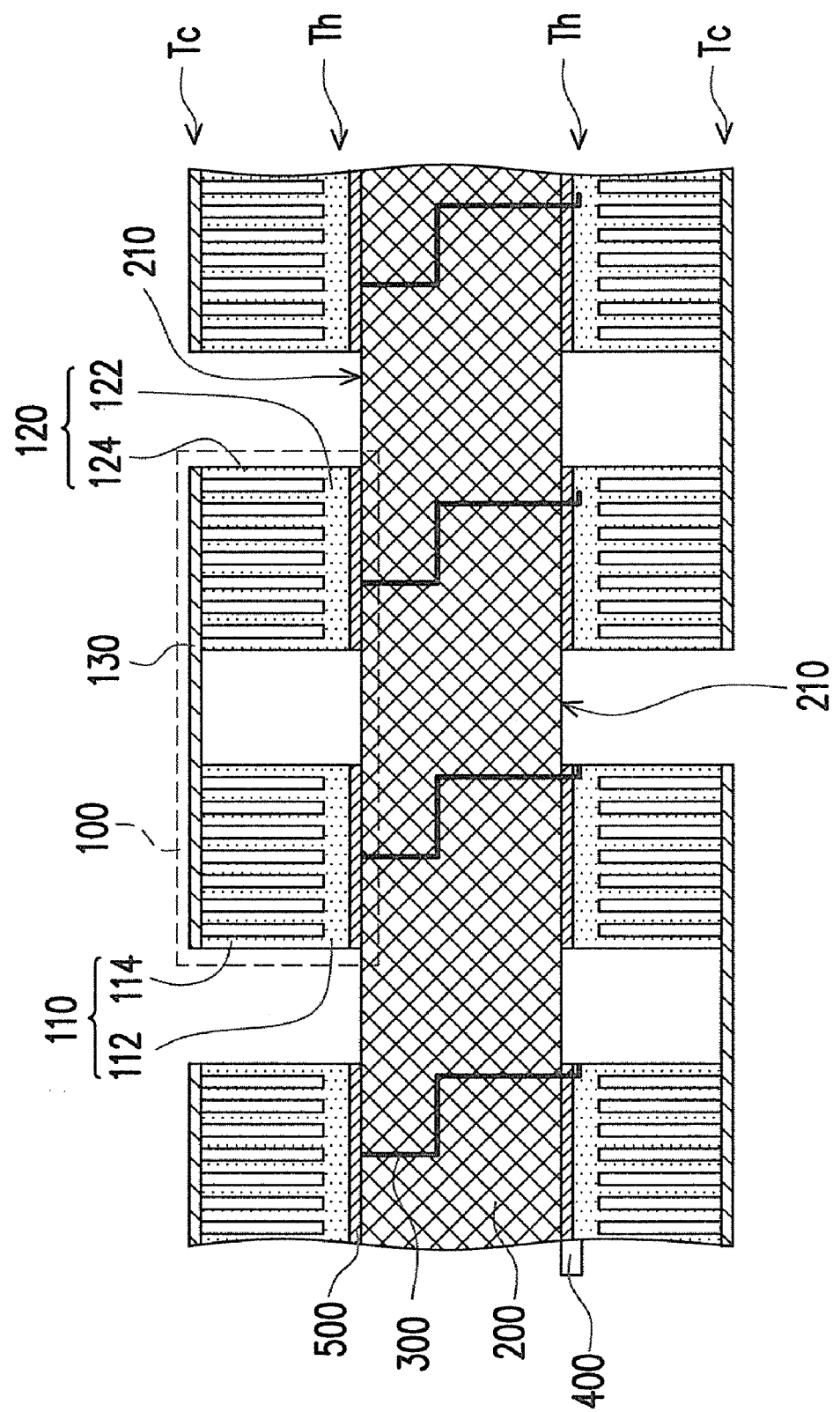
FIG. 3 is a schematic diagram illustrating assembling the thermoelectric device upon a heat source according to an embodiment of the present invention.

FIG. 3 is a schematic diagram illustrating assembling the thermoelectric device upon a heat source according to an embodiment of the present invention. The present invention does not restrict the quantity of the thermoelectric devices disposed upon the heat source. One or more thermoelectric device(s) can be disposed thereupon. In the subsequent embodiment, the present invention is to be illustrated as including a plurality of thermoelectric devices disposed upon the heat source. Referring to FIG. 3, a thermoelectric device of the current embodiment includes a plurality of thermoelectric component sets 100 disposed upon a surface of a heat source 200.

In the current embodiment, each thermoelectric component set 100 has a first substrate 112 and a second substrate 122 disposed upon the heat source 200. Thermoelectric component sets 100 are disposed on a surface 210 of the heat source 200. The first thermoelectric component 110 and the second thermoelectric component 120 of each thermoelectric component set 100 are electrically connected together by an electrically conductive layer 130. Two adjacent thermoelectric component sets 100 are electrically connected one to another by a connecting wire 300. In this manner, the plurality of thermoelectric component sets 100 are serially connected one to another. The connecting wire 300 is positioned on a surface of the heat source 200. The serially connected thermoelectric components 100 can be further coupled to an electrode contact 400 for outputting the current therefrom.

Specifically, a thermal conductivity coefficient of the first substrate 112 and the second substrate 122 is greater than a thermal conductivity of the first nanowire structure 114 and the second nanowire structure 124. Therefore, when the heat source 200 generates a heat, the heat is preferentially transferred toward the first substrate 112 and the second substrate 122. The heat is transferred along a heat transferring direction which is parallel with the first nanowire structure 114 and the second nanowire structure 124. Meanwhile, electrons in the first thermoelectric component 110 and electrons in the second thermoelectric component 120 migrate in accordance with the thermoelectric effect, thus forming a current loop with the electrically conductive layer 130 for outputting a current.

In the current embodiment, the heat source 200 for example is a micro-power system, a micro-engine, a micro-reformer, or any other active component or passive component. The first nanowire structure 114 and the second nanowire structure 124 are fixed to the heat source 200 via the first substrate 112 and the second substrate 122 which are directly attached to the heat source 200. Supposing that the heat source 200 is a micro-power system for example, a temperature of the surface of the micro-power system is over 500K, and therefore the micro-power system can be served as a high temperature heat source (Th) of the thermoelectric device for power generation. Therefore, the thermoelectric device can recycle the heat generated by the micro-power system for generating electrical energy and providing the generated electrical energy as an auxiliary power supply. In such a way, an overall power generation efficiency of the micro-power system can be improved, and the output power can be improved either.

The first thermoelectric component 110 and the second thermoelectric component 120 are jointed with the surface of the heat source 200 in a same direction. A direction of nanowires of the first nanowire structure 114 and the second nanowire structure 124 is parallel with the heat transferring direction. An end of the first nanowire structure 114 and an end of the second nanowire structure 124 are coupled to the first substrate 112 and the second substrate 124, respectively, in which the positions where they are coupled is a system high temperature section (Th). Further, another end of the first nanowire structure 114 and another end of the second nanowire structure 124 are coupled to the electrically conductive layer 130, respectively, in which the positions where they are coupled is a system low temperature section (Tc). Therefore, a system high temperature section (Th) and a system low temperature section (Tc) are distributed at two ends of the thermoelectric component set 100, so that a fixed temperature difference between the system high temperature section (Th) and the system low temperature section (Tc) is presented over thermoelectric component set 100. The thermal energy is thus converted into an electrical energy according to the thermoelectric effect, and is thus outputted from the electrode contact 400.

According to the present invention, the first thermoelectric component 110 and the second thermoelectric component 120 are fixed to the surface of the heat source 200 by the first substrate 112 and the second substrate 122 which are directly attached to the surface of the heat source 200. As such, there is no need to employ an additional ceramic substrate or other interface material serving as a thermal conductive layer. Therefore, the contact thermal resistance and electric resistance which usually occur at the ceramic substrate or interface material of a conventional thermoelectric device can be saved. Further, the heat generated by the heat source 200 can be transversally, promptly and uniformly transferred to the first substrate 112 and the second substrate 122. Moreover, for further improving the thermal transferring performance, the embodiment can also alternatively employ a thermal conductive layer 500 between the thermoelectric component set 100 and the heat source 200 as shown in FIG. 3. It should be note that the thermal conductive layer 500 is not a necessary element compulsorily required in the embodiment of the present invention.

Along a longitudinal direction (i.e., the direction parallel with the nanowires), the first nanowire structure 114 and the second nanowire structure 124 having a high ZT value is capable of effectively executing the thermo-to-electric energy conversion to convert the heat into an electrical energy for outputting. Further, the nanowire structures of the present invention are fabricated by a chemical etching process. Such nanowire structures can be fabricated with a high aspect ratio and the nanowire may have a length about 50 to 120 μm. As such, the overall functional area of the thermoelectric device increases, and thus the output current and output power of the thermoelectric device can be drastically improved. Therefore, the thermoelectric device of the present invention is adapted for application of portable power systems. Further, the embodiment of the present invention directly fabricates the nanowire structures on the silicon substrate, and therefore is adapted for recycling waste heat generated from a micro-power source for power generation. The present invention has the advantages such as lower cost, lighter weight, and higher efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thermoelectric device, disposed upon a heat source, the thermoelectric device comprising:
   a plurality of thermoelectric component sets, each of the thermoelectric component sets comprising:
   a first thermoelectric component provided in one-piece and consisting of a common material, the first thermoelectric component comprising a first substrate directly attached to a surface of the heat source and a first nanowire structure extended from the first substrate;
   a second thermoelectric component provided in one-piece and consisting of a common material, the second thermoelectric component comprising a second substrate directly attached to a surface of the heat source and a second nanowire structure extended from the second substrate; and
   an electrically conductive layer, covering the first nanowire structure and the second nanowire structure, and being coupled to the first nanowire structure and the second nanowire structure; and
   a connecting wire connecting the thermoelectric component sets for configuring a passage of current for outputting an electrical energy wherein the first thermoelectric component or the second thermoelectric component is made of silicon material.

2. The thermoelectric device according to claim 1, wherein the thermoelectric component sets are serially connected to one another.

3. The thermoelectric device according to claim 1, wherein the first thermoelectric component comprises a P-type thermoelectric material, and the second thermoelectric component comprises an N-type thermoelectric material.

4. The thermoelectric device according to claim 1, wherein the first thermoelectric component or the second thermoelectric component is made of silicon material.

5. A thermoelectric device, disposed upon a heat source, the thermoelectric device comprising a thermoelectric component set, the thermoelectric component set comprising:
- a first thermoelectric component provided in one-piece and consisting of a common material, the first thermoelectric component comprising a first substrate attached to a surface of the heat source and a first nanowire structure extended from the first substrate;
- a second thermoelectric component provided in one-piece and consisting of a common material, the second thermoelectric component comprising a second substrate attached to a surface of the heat source and a second nanowire structure extended from the second substrate; and
- a electrically conductive layer, covering the first nanowire structure and the second nanowire structure, and being coupled to the first nanowire structure and the second nanowire structure wherein the first thermoelectric component or the second thermoelectric component is made of silicon material.

6. The thermoelectric device according to claim 1, wherein the first thermoelectric component comprises a P-type thermoelectric material, and the second thermoelectric component comprises an N-type thermoelectric material.

7. The thermoelectric device according to claim 1, wherein the first nanowire structure comprises a plurality of first nanowires spaced from one another by air gaps.

8. The thermoelectric device according to claim 1, wherein the second nanowire structure comprises a plurality of second nanowires spaced from one another by air gaps.

9. The thermoelectric device according to claim 5, wherein the first nanowire structure comprises a plurality of first nanowires spaced from one another by air gaps.

10. The thermoelectric device according to claim 5, wherein the second nanowire structure comprises a plurality of second nanowires spaced from one another by air gaps.

* * * * *